United States Patent
Yan et al.

(10) Patent No.: US 11,177,241 B2
(45) Date of Patent: Nov. 16, 2021

(54) SEMICONDUCTOR DEVICE WITH TOP DIE POSITIONED TO REDUCE DIE CRACKING

(71) Applicant: WESTERN DIGITAL TECHNOLOGIES, INC., San Jose, CA (US)

(72) Inventors: Junrong Yan, Shanghai (CN); Jianming Zhang, Shanghai (CN); Min Zhao, Shanghai (CN); Kailei Zhang, Shanghai (CN); Chee Keong Chin, Shanghai (CN); Kim Lee Bock, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 22 days.

(21) Appl. No.: 16/814,761

(22) Filed: Mar. 10, 2020

(65) Prior Publication Data
US 2020/0381401 A1 Dec. 3, 2020

(30) Foreign Application Priority Data
May 31, 2019 (CN) .......................... 201910469575.0

(51) Int. Cl.
*H01L 25/065* (2006.01)
*H01L 23/00* (2006.01)

(52) U.S. Cl.
CPC ........ *H01L 25/0657* (2013.01); *H01L 23/562* (2013.01); *H01L 24/94* (2013.01)

(58) Field of Classification Search
CPC .... H01L 25/0657; H01L 23/562; H01L 24/94
See application file for complete search history.

(56) References Cited

U.S. PATENT DOCUMENTS

| | | | | |
|---|---|---|---|---|
| 6,900,528 B2 * | 5/2005 | Mess | ...................... | H01L 24/49 257/686 |
| 7,262,506 B2 * | 8/2007 | Mess | ................. | H01L 23/49575 257/777 |
| 7,652,376 B2 * | 1/2010 | Park | ...................... | H01L 25/50 257/737 |
| 7,683,491 B2 * | 3/2010 | Itoh | ......................... | H01L 23/50 257/777 |
| 7,906,853 B2 * | 3/2011 | Wang | ................. | H01L 25/0657 257/777 |
| 7,944,036 B2 * | 5/2011 | Sasaki | ................ | H01L 25/0657 257/686 |
| 8,299,627 B2 * | 10/2012 | Kim | .................... | H01L 25/0657 257/777 |
| 8,643,193 B2 * | 2/2014 | Kim | ....................... | H01L 25/18 257/777 |
| 9,543,231 B2 * | 1/2017 | Choi | ..................... | H01L 23/481 |
| 10,985,136 B2 * | 4/2021 | Hiemstra | ............... | H01L 24/17 |
| 2010/0252615 A1 | 10/2010 | Suga et al. | | |
| 2014/0127860 A1 | 5/2014 | Muto | | |
| 2015/0014838 A1 * | 1/2015 | Yap | ........................ | H01L 24/96 257/706 |
| 2018/0308927 A1 | 10/2018 | Hanson et al. | | |
| 2020/0266133 A1 * | 8/2020 | Glasscock | .............. | H01L 24/81 |

* cited by examiner

*Primary Examiner* — Nicholas J Tobergte
(74) *Attorney, Agent, or Firm* — Vierra Magen Marcus LLP (57) ABSTRACT

A semiconductor device is disclosed including a die stack including a number of dies aligned with each other with respect to an axis, and a top die that is offset along the axis the to prevent die cracking.

20 Claims, 9 Drawing Sheets

SEMICONDUCTOR DEVICE WITH TOP DIE POSITIONED TO REDUCE DIE CRACKING

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory semiconductor products may in general be fabricated as system-in-a-package (SIP) or multichip modules (MCM), where a plurality of semiconductor die are mounted and interconnected to an upper surface of substrate. The substrate may in general include a rigid, dielectric base having a conductive layer etched on one or both sides. Solder balls are often mounted on contact pads formed on a lower surface of the substrate to allow the substrate to be soldered to a host device such as a printed circuit board. Once mounted, signals may be transferred between the semiconductor die in the package and the host device via the substrate.

There is an ever-present demand to provide greater storage capacity in a smaller overall form factor semiconductor package. One way this done is to decrease the thickness of the semiconductor dies within the package without losing, or even gaining, storage capacity. One shortcoming of decreasing the thickness of the semiconductor dies is that they become more fragile, and prone to cracking for example when subjected to the encapsulation process. Of all of the dies in a package, the uppermost die is generally most prone to cracking. This is so because there are no other dies above to provide structural support. This is also true because the uppermost die has the shortest heating time used to bond the die to the stack. For example, the bottom die is heated not just when it is added, but when each subsequent die is added. There are no dies added subsequent to the uppermost die, so it only undergoes the single heating process associated with its attachment.

DETAILED DESCRIPTION

The present technology will now be described with reference to the figures, which in embodiments, relate to a semiconductor device including a top die that is offset to prevent die cracking. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

Figure 1:
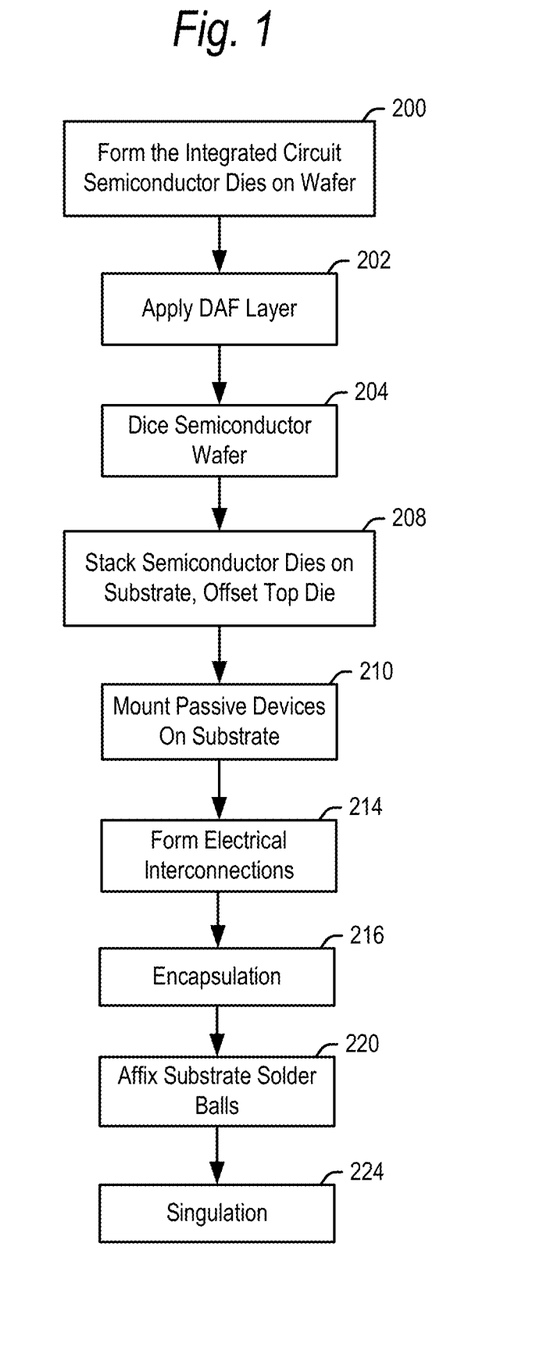
FIG. 1 is a flowchart for forming a semiconductor device according to embodiments of the present technology.
Figure 2:
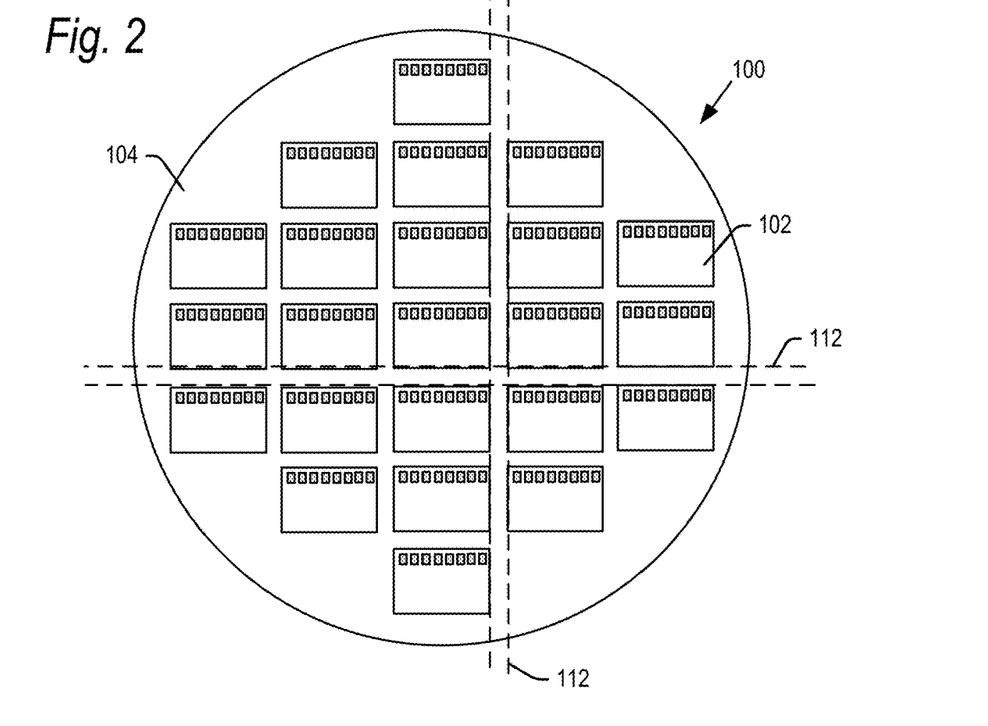
FIG. 2 is a top view of a semiconductor wafer including semiconductor dies according to embodiments of the present technology.

An embodiment of the present technology will now be explained with reference to the flowchart of FIG. 1, and the views of FIGS. 2-18. In step 200, a semiconductor wafer 100 may be processed into a number of semiconductor dies 102 as shown in FIG. 2. The semiconductor wafer 100 may start as an ingot of wafer material which may be monocrystalline silicon grown according to either a Czochralski (CZ) or floating zone (FZ) process. However, wafer 100 may be formed of other materials and by other processes in further embodiments.

Figure 3:
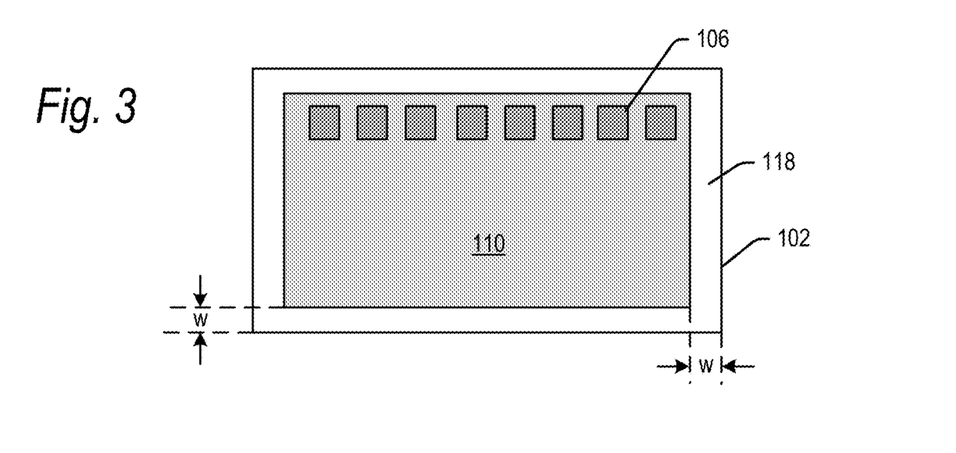
FIG. 3 is a top view of a semiconductor die according to embodiments of the present technology.

The semiconductor wafer 100 may be cut from the ingot and polished on both the first major planar surface 104, and second major planar surface 105 (FIG. 4) opposite surface 104, to provide smooth surfaces. The first major surface 104 may undergo various processing steps to divide the wafer 100 into the respective semiconductor dies 102. In particular, in step 200, the semiconductor dies 102 may be processed in embodiments to form integrated circuits and internal electrical connections in a dielectric substrate. A top surface of the semiconductor dies may include a polyimide (PI)/passivation layer 110, and die bond pads 106 (FIG. 3). The number of semiconductor dies 102 shown on wafer 100 in FIG. 2 is for illustrative purposes, and wafer 100 may include more semiconductor dies 102 than are shown in further embodiments.

As is known, dicing streets 112 may be defined between the rows and columns of semiconductor dies 102 on wafer 100. One horizontal dicing street and one vertical dicing street are shown in dashed lines and labeled in FIG. 2, but the horizontal and vertical dicing streets are provided around each of the semiconductor dies in the wafer 100. These dicing streets 112 are left devoid of integrated circuits and the PI/passivation layer 110, and are provided as areas where the wafer may be diced, for example by a blade or a laser. In embodiments, the dicing streets 112 may be 70 µm wide, though the dicing streets 112 may be wider or narrower than that in further embodiments. After the wafer 100 is processed to form integrated circuits, a die attach film (DAF) layer 114 (FIG. 4) may be formed on the second major planner surface 105 in step 202.

In step 204, the semiconductor wafer 100 may be diced along the dicing streets 112 to separate the individual semiconductor dies 102 from the wafer 100. An individual semiconductor die 102 shown in top and edge views in FIGS. 3 and 4, respectively. In embodiments, the wafer 100 may be diced using a laser, which provides a highly accurate and controlled cut of the wafer with a narrow kerf width. The result is that the diced semiconductor dies 102 each includes a border around its four edges including part (e.g., one-half) the width of the dicing streets 112. As noted, these borders, labeled 118 in the figures, are devoid of any integrated circuits and are devoid of the PI/passivation layer 110.

Figure 4:
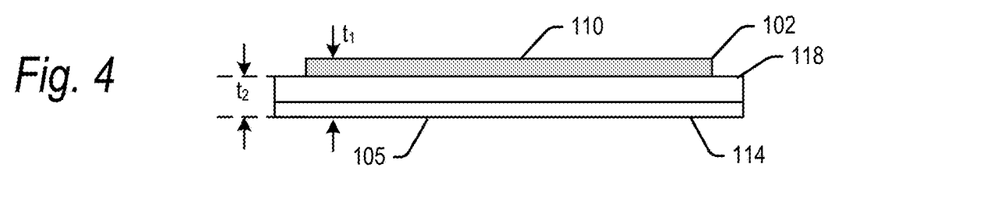
FIG. 4 is an edge view of a semiconductor die according to embodiments of the present technology.

In embodiments, the border 118 may have a width, w, of 35 µm, though this width may be lesser or greater than that in further embodiments. In embodiments, the border 118 may have the same width around all four edges of the semiconductor die 102, though the border may have unequal widths around one or more edges in further embodiments. As seen in FIG. 4, the PI/passivation layer 110 may extend above the border 118 formed around the outer perimeter of the semiconductor dies 102. Thus, semiconductor die 102 includes an interior portion having a thickness $t_1$, and an exterior border with a thickness, $t_2 < t_1$. In embodiments, the thickness, $t_1$, of the interior portion of the die 102 (including the DAF layer 114) may be 43.4 µm, and the thickness, $t_2$, of the border portion surrounding the die 102 may be 37 µm. These thicknesses are by way of example only and may vary in further embodiments.

In addition to insulation and protection, the PI/passivation layer 110 provides additional strength to semiconductor dies 102 along an axis perpendicular to the major surfaces 104, 105. Thus, the semiconductor die 102 is stronger, and has greater resistance to shear and bending forces, along a cross-section through the die 102 including the PI/passivation layer 110 than a cross-section through the border 118.

Figure 5:
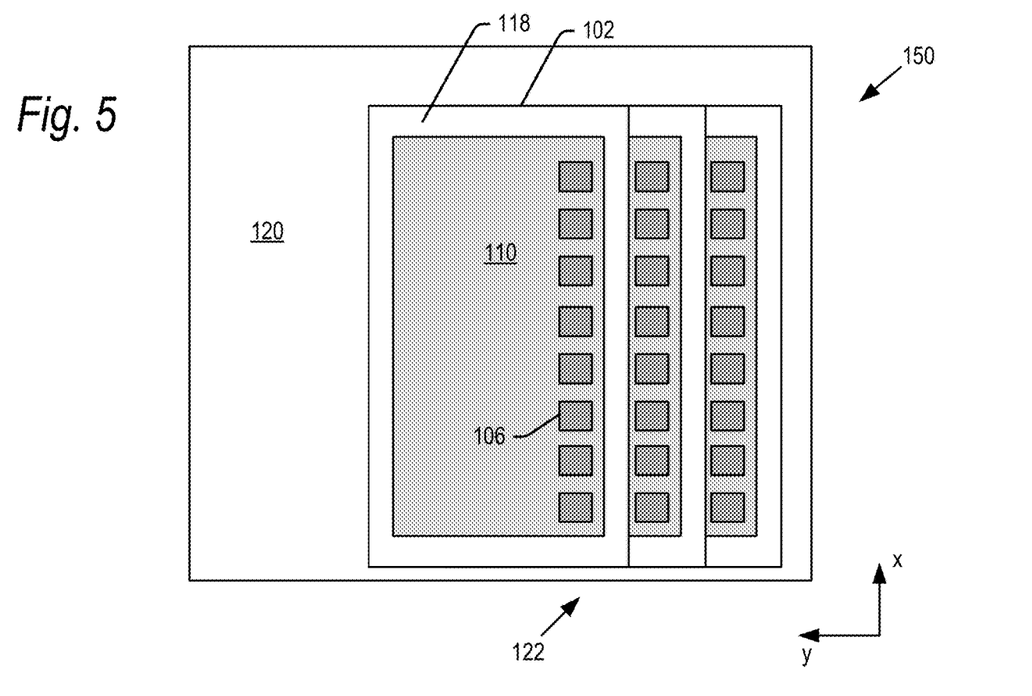
FIG. 5 is a top view of a group of stacked semiconductor dies according to embodiments of the present technology.
Figure 6:
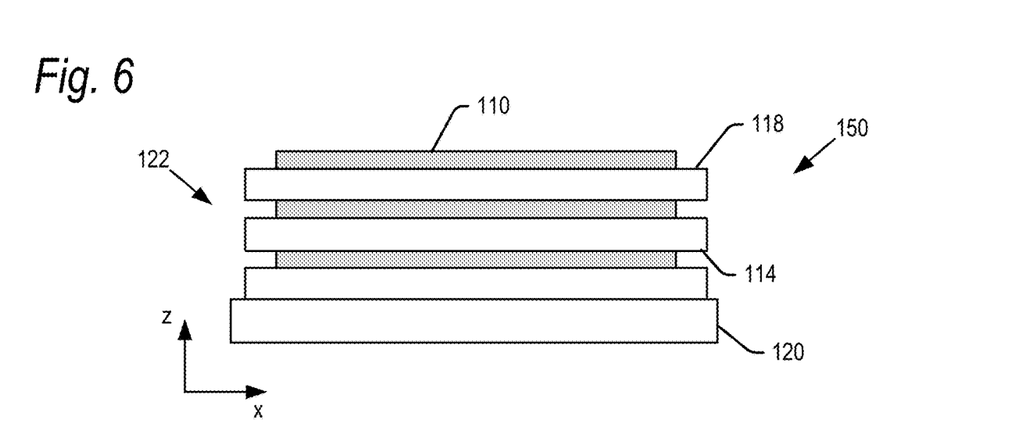
FIG. 6 is a front edge view of the group of semiconductor dies of FIG. 5 according to embodiments of the present technology.
Figure 7:
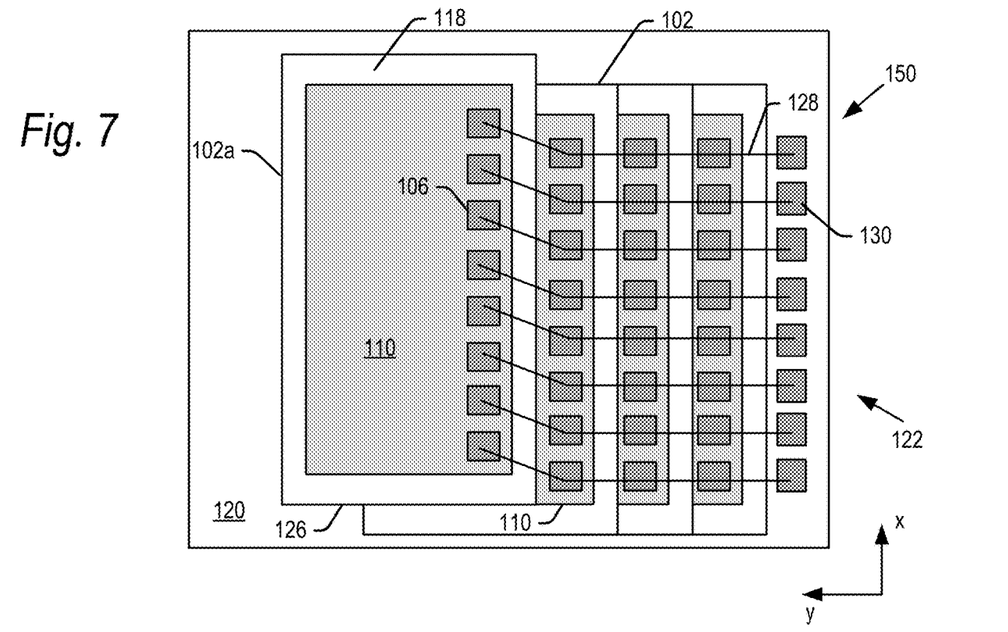
FIG. 7 is a top view of a group of stacked and wire bonded semiconductor dies according to embodiments of the present technology.
Figure 8:
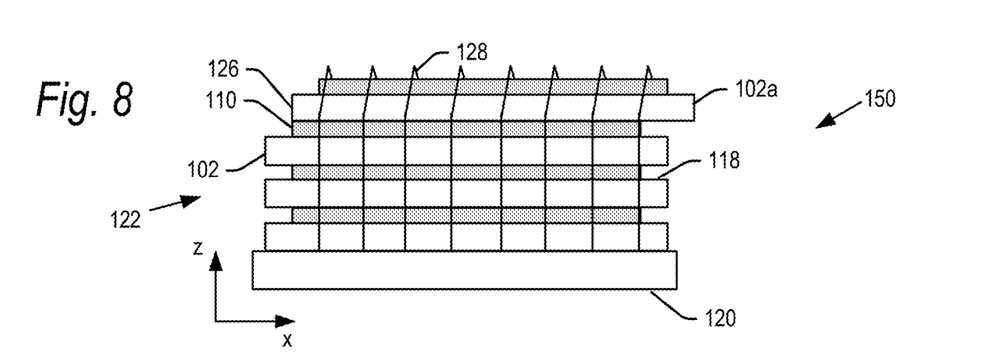
FIG. 8 is a front edge view of a group of stacked and wire bonded semiconductor dies of FIG. 7 according to embodiments of the present technology.
Figure 9:
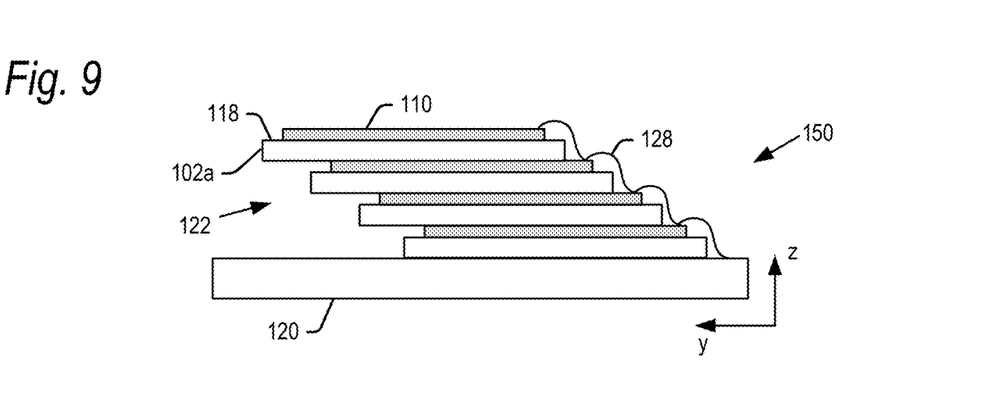
FIG. 9 is a side edge view of a group of stacked and wire bonded semiconductor dies of FIG. 7 according to embodiments of the present technology.
Figure 10:
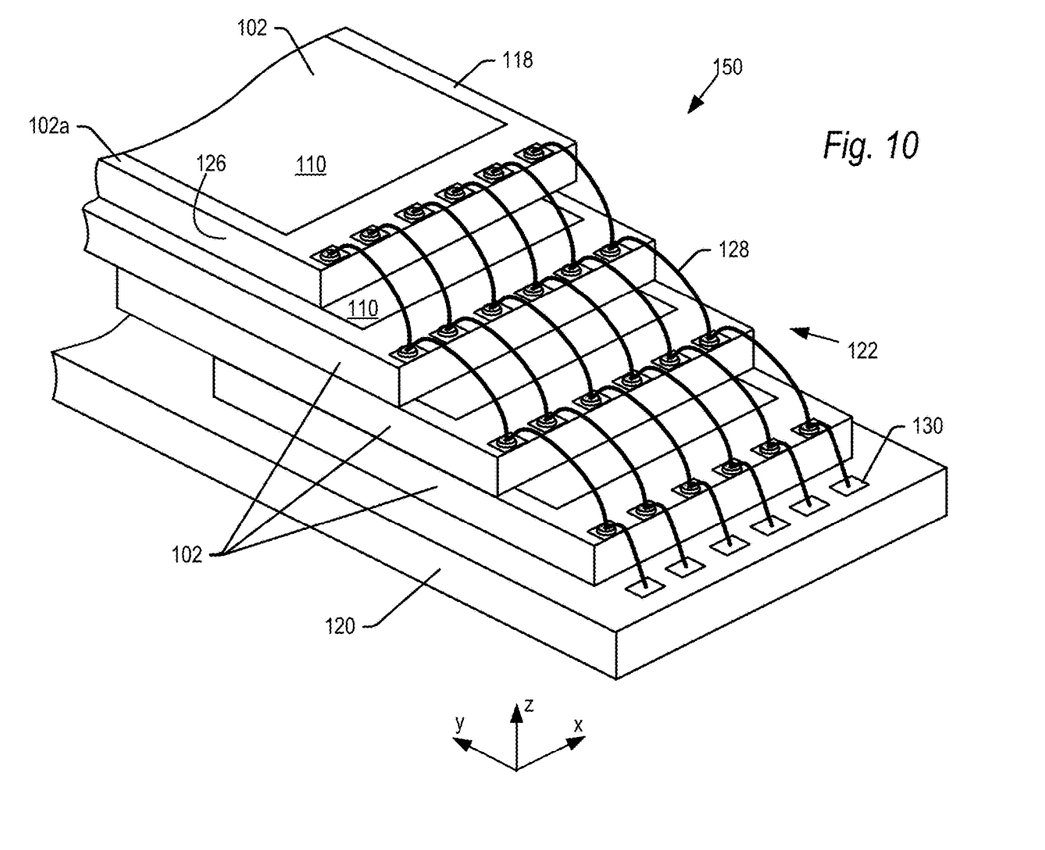
FIG. 10 is a perspective view of a group of stacked and wire bonded semiconductor dies of FIG. 7 according to embodiments of the present technology.

After dicing, a number of semiconductor dies 102 may be mounted on a substrate in step 208, such as substrate 120 shown in FIGS. 5 and 6. FIGS. 5 and 6 show top and front edge views, respectively, of a portion of a semiconductor device 150 including some of the dies in the die stack 122. An additional die 102 will be added to the stack 122 as explained below. In the die stack 122 shown in FIGS. 5 and 6, the dies are stacked in a stepped, offset configuration in they direction such the row of die bond pads 106 on a first die 102 is left uncovered and exposed by a second die 102 mounted thereon. The dies 102 in stack 122 may be aligned with each other with respect to the x-axis. The dies 102 may be affixed to the substrate 120 and each other by the DAF layer 114 (not separately marked in FIGS. 5-19). As seen in FIG. 6, the thickness of the PI/passivation layers 110 provide a space between the borders 118 of adjacent dies 102 in the stack 122.

FIGS. 7, 8, 9 and 10 show top, front edge, side edge and perspective views, respectively, of a portion of a semiconductor device 150 including a complete die stack 122. In the die stack 122 shown in FIGS. 7-10, an uppermost die 102a has been added to the stack. The die 102a is stepped in an offset configuration in the y direction as in the dies 102 lower in the stack 122. In accordance with aspects of the technology, the die 102a is also offset in the x-direction. The die 102a may be offset along the x-axis so that an edge of 126 (FIGS. 7, 8 and 10) of the die 102a lies over the PI/passivation layer 110 of the next lower die 102. In embodiments, the offset along the x-axis of top die 102a may be 6.4 µm, though it may be more or less than that in further embodiments. Additionally, while the edge 126 is shown mounted directly over the PI/passivation layer 110 of the next lower die 102, it is understood that the x-axis offset may be increased, so that the edge 126 of die 102a is spaced inward of an edge of the PI/passivation layer 110 of the next lower die.

The semiconductor dies 102 may be any of various semiconductor dies including for example memory dies such as 2D NAND flash memory or 3D BiCS (Bit Cost Scaling), V-NAND or other 3D flash memory. However, other types of semiconductor dies may be used, including for example RAM such as an SDRAM, DDR SDRAM, LPDDR and GDDR. Additionally, a controller die such as an ASIC (not shown) may also be mounted on the substrate or on top of the stack 122 in step 208.

Either before or after the semiconductor dies are mounted on the substrate 120, passive components (not shown) may also be mounted on the substrate 120 in step 210. Passive components may include for example resisters, capacitors and/or inductors.

Once the dies 102 (including die 102a) are mounted in the stack 122, the dies 102 may be electrically interconnected to each other and the substrate 120 in step 214. In one embodiment, the electrical interconnections may be wire bonds 128 as shown in FIGS. 7-10. The wire bonds may be formed in a known wire bonding process using a wire bond capillary (not shown), which connects corresponding die bond pads 106 in different dies 102 to each other and to contact pads 130 (FIGS. 7 and 10) on the substrate 120. Wire bonds may extend straight up the die stack 122 and then they proceed diagonally between the uppermost die 102a and the next lower die.

The wire bonds 128 may for example be wedge bonds formed on ball bonds deposited on the bond pads 106 and contact pads 130, though other types of wire bonds are possible in further embodiments. Moreover, instead of wire bonds, it is conceivable that the electrical interconnections may be formed by through silicon vias (TSVs) formed down through the different dies 102 in the stack 122 and into contact with a pattern of contact pads on the substrate 120.

Figure 11:
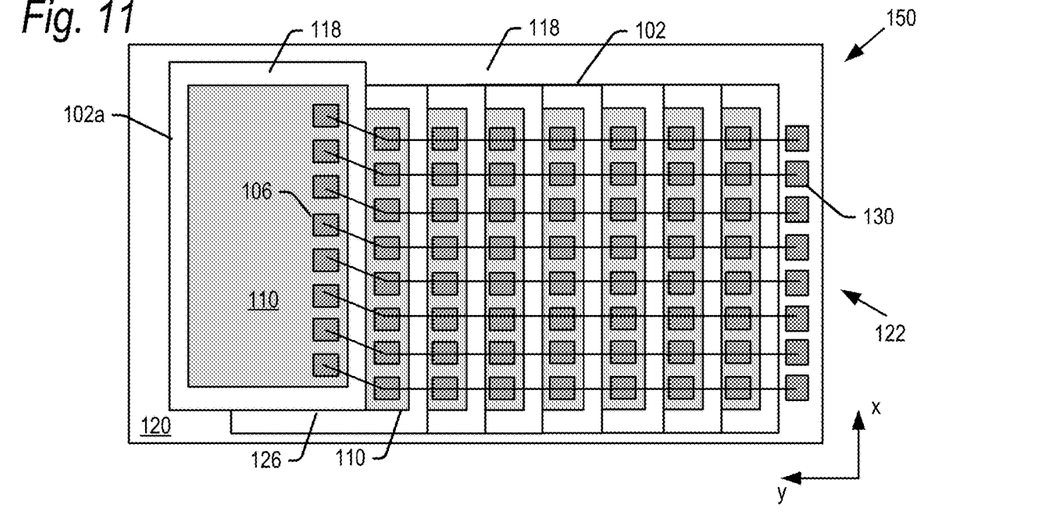
FIG. 11 is a top view of a group of stacked and wire bonded semiconductor dies according to embodiments of the present technology.
Figure 12:
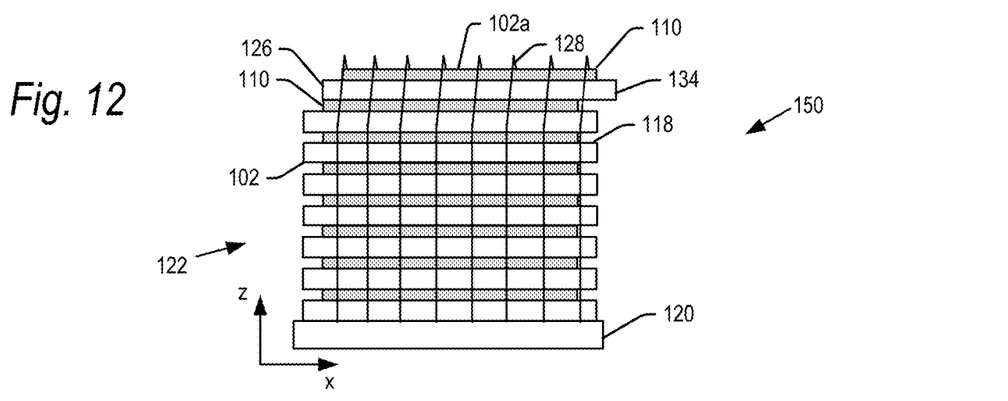
FIG. 12 is a front edge view of a group of stacked and wire bonded semiconductor dies of FIG. 11 according to embodiments of the present technology.
Figure 13:
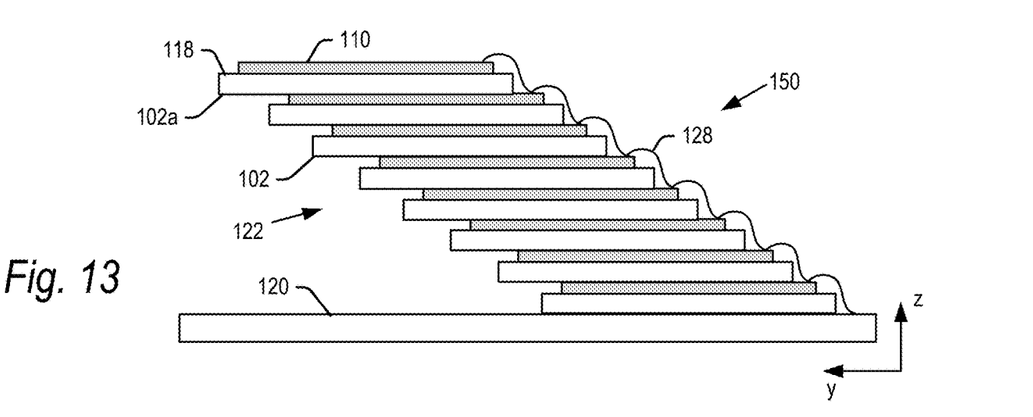
FIG. 13 is a side edge view of a group of stacked and wire bonded semiconductor dies of FIG. 11 according to embodiments of the present technology.

While FIGS. 7-10 show four semiconductor dies in stack 122, it is understood that stack 122 may include various numbers of memory dies in further embodiments, including for example 2, 8, 16, 32 and 64 memory dies. Other numbers of dies between 2 and 64, and greater than 64, are possible. FIGS. 11-13 illustrate top, front edge and side edge views of one such further embodiment including eight semiconductor dies. As above, all dies in the die stack 122 are offset along the y-axis in a stepped configuration. All dies in the die stack 122 except the uppermost die 102a are aligned with each other with respect to the x-axis. As above, the uppermost die 102a is offset along the x-axis, so that an edge 126 of die 102a is aligned over the PI/passivation layer 110 of the next lower die.

Figure 14:
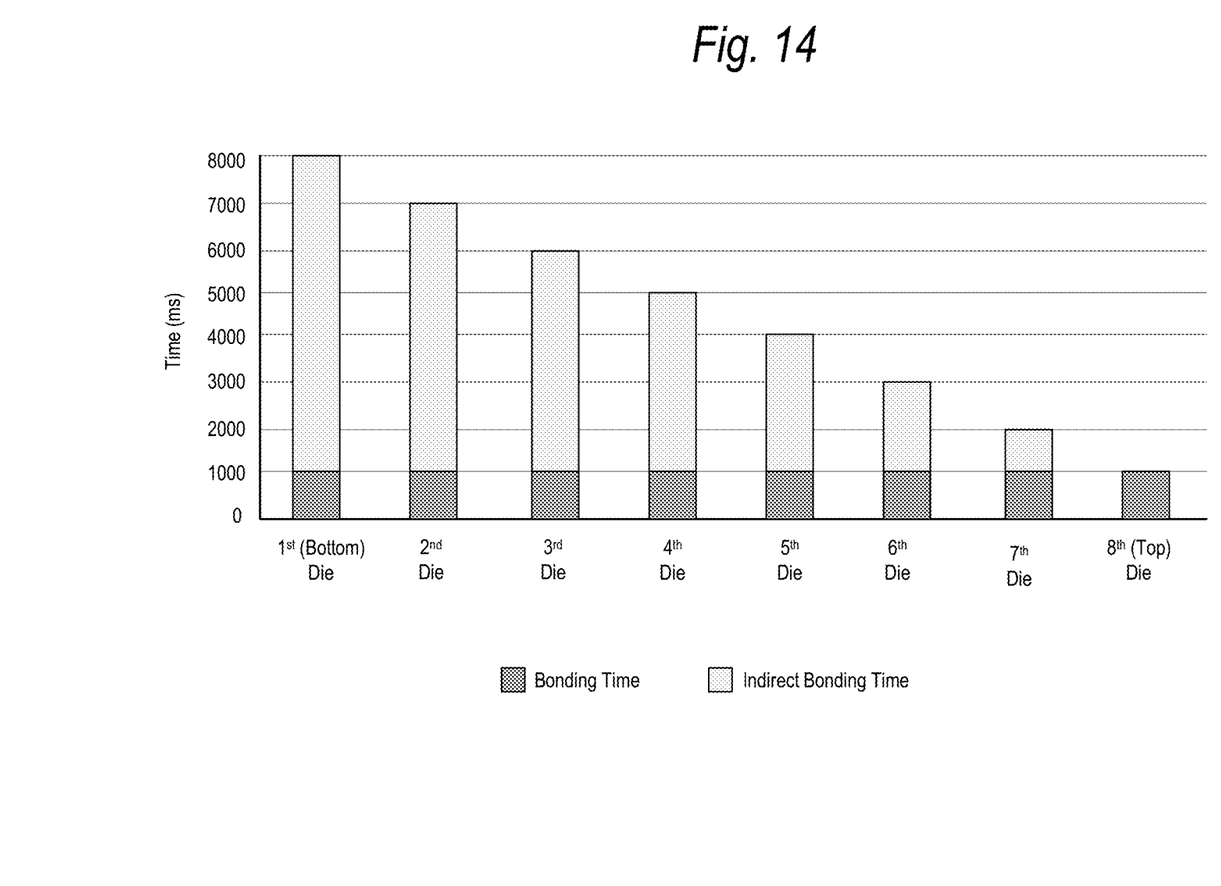
FIG. 14 is a chart of bond in times for different semiconductor dies in a die stack shown in FIG. 11 according to embodiments of the present technology.

As noted in the Background section, given the thin profile of modern day semiconductor dies, they are fragile and prone to cracking during fabrication. For example, given the height of the PI/passivation layers, the semiconductor dies are unsupported around their edges in the border areas. When subjected to stress, for example during the encapsulation process, the dies may crack at these edges. This may be most true at the top semiconductor die, as this die undergoes the least amount of curing time. As shown in the chart of FIG. 14, each of the dies in an eight die stack undergoes 1 second of direct bonding. However, the earlier bonded dies (i.e., those lower in the stack 122) also undergo an indirect bonding time. For example, the first (bottom-most) die undergoes 1 second of direct bonding time, and then an additional 1 second of indirect bonding time for each additional die added to the die stack. Every die in stack 122 undergoes this additional indirect bonding time, except for the uppermost die. As such, the uppermost die 102a has the weakest bond to the stack, and may bend and/or break when subjected to stress.

The present technology addresses this problem by offsetting the uppermost die 102a along the x-axis. In so doing, the outer edge 126 of the die 102a is completely supported on the die below it (i.e., on the PI/passivation layer 110 of the die below it). The opposite edge, edge 134 (FIG. 12), still overhangs empty space. However, the portion of the die 102a at edge 134 which overhangs empty space also includes the PI/passivation layer 110. Thus, the portion of the die 102a extending out beyond the PI/passivation layer 110 of the next lower die has a greater thickness at the overhang (i.e., the thickness of the border 118 plus the thickness of the PI/passivation layer 110). This relatively greater thickness at the overhang area at edge 134 (as compared to the lower die) provides a greater strength and resistance to shear stresses than the lower dies in the stack.

Figure 15:
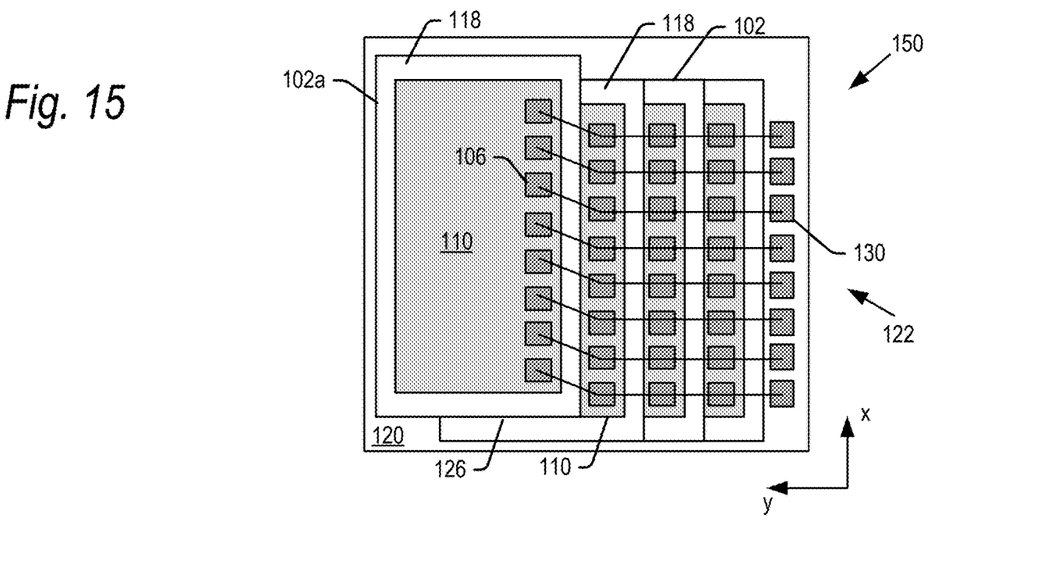
FIG. 15 is a top view of a group of stacked and wire bonded semiconductor dies according to embodiments of the present technology.
Figure 16:
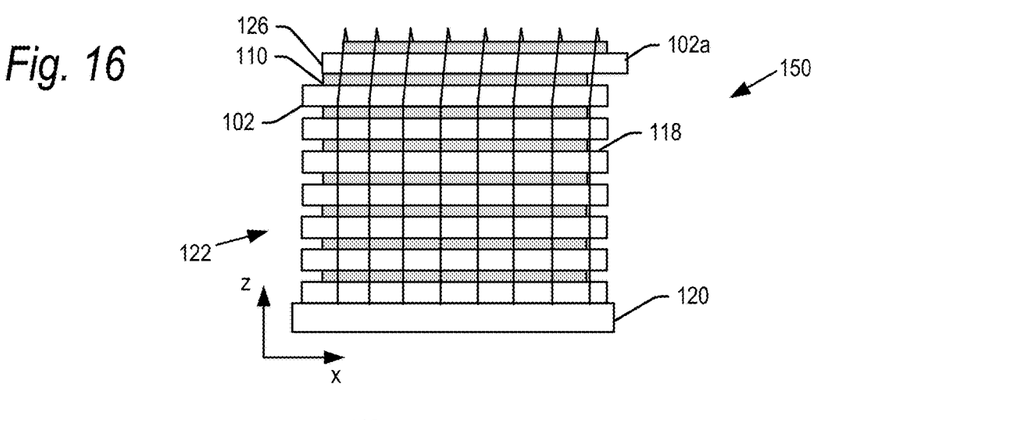
FIG. 16 is a front edge view of a group of stacked and wire bonded semiconductor dies of FIG. 11 according to embodiments of the present technology.
Figure 17:
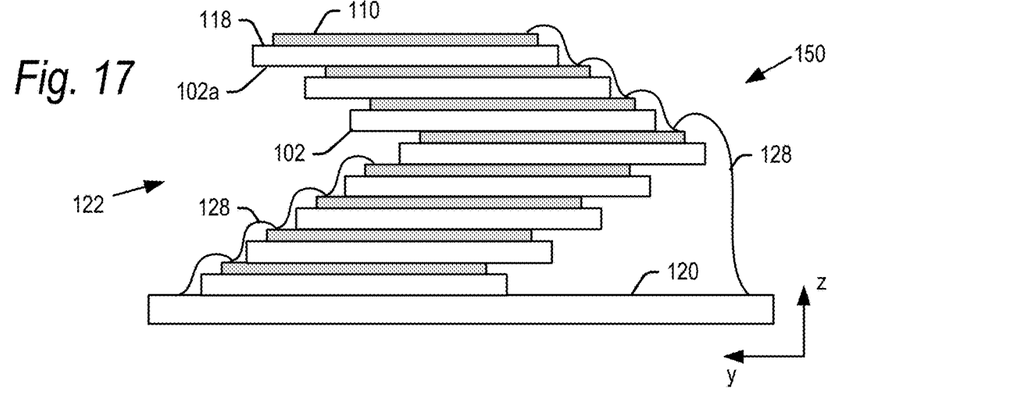
FIG. 17 is a side edge view of a group of stacked and wire bonded semiconductor dies of FIG. 11 according to embodiments of the present technology.

FIGS. 15-17 show top, front edge and side edge views, respectively, of a further embodiment including eight dies in the stack 122. As seen for example in FIG. 17, instead of each of the dies being offset in the same direction along the y-axis, the die stack doubles back on itself. Such an embodiment may provide a smaller footprint on the substrate in the x-y plane. In this embodiment, wire bonds 128 may connect to two rows of contact pads on the substrate 120 at opposite edges of the substrate 120 as shown in FIG. 17. All of the dies may be aligned with each other along the x-axis, with the exception of the uppermost die 102a, which may be offset along the x-axis as described above.

Figure 18:
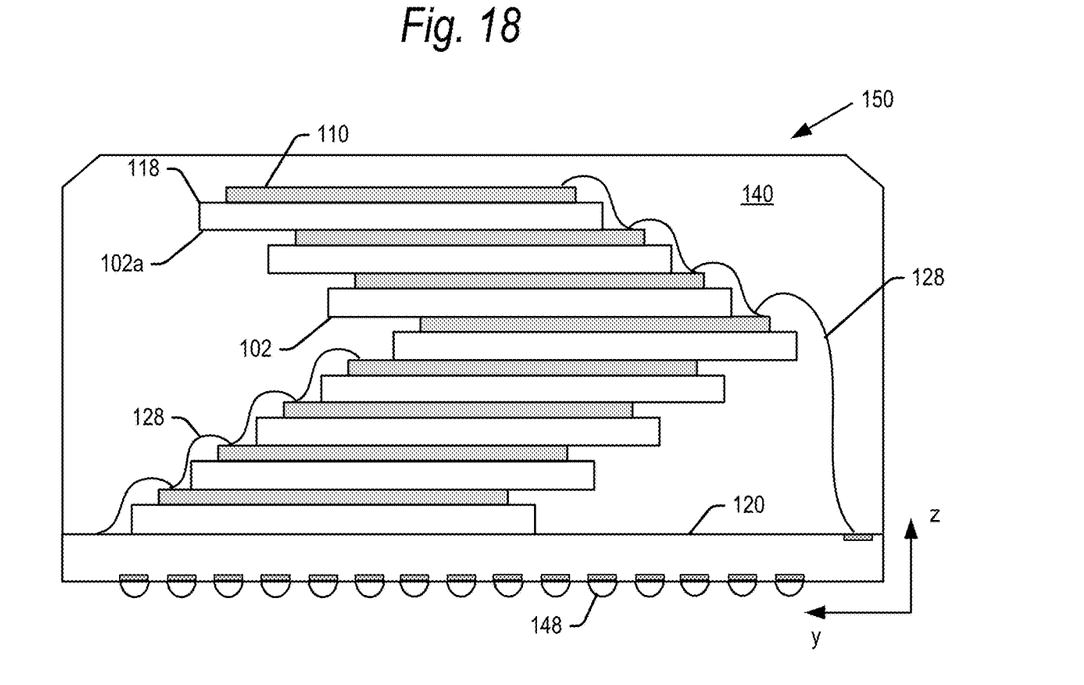
FIG. 18 is a side edge view of a completed semiconductor device according to embodiments of the present technology.

Referring again to FIG. 1, after the semiconductor dies 102 are mounted in stack 122 and electrically interconnected, the semiconductor dies 102 may be encapsulated in step 216 in mold compound 140 as shown in FIG. 18. Mold compound 140 may include for example solid epoxy resin, Phenol resin, fused silica, crystalline silica, carbon black and/or metal hydroxide. Other mold compounds from other manufacturers are contemplated. The mold compound may be applied by various known processes, including by compression molding, FFT (flow free thin) molding, transfer molding or injection molding techniques.

During fabrication, the substrates 120 may be kept as a panel of many substrates to achieve economies of scale during fabrication. After the encapsulation step, the individual semiconductor devices 150 may be singulated (separated) from each other in step 220 to form a completed semiconductor device shown in FIG. 18. Depending on the application of semiconductor device 150, a pattern of solder balls 148 may be applied on the bottom surface of the substrate 120 as shown in FIG. 18. The solder balls may for example be applied prior to step 208 of mounting the dies on the substrate. The semiconductor device 150 may then be mounted on a host device (not shown) by soldering the solder balls 148 on to contact pads of the host device. Thereafter, communication between the semiconductor device 150 and the host device may be accomplished through the semiconductor dies 102.

Figure 19:
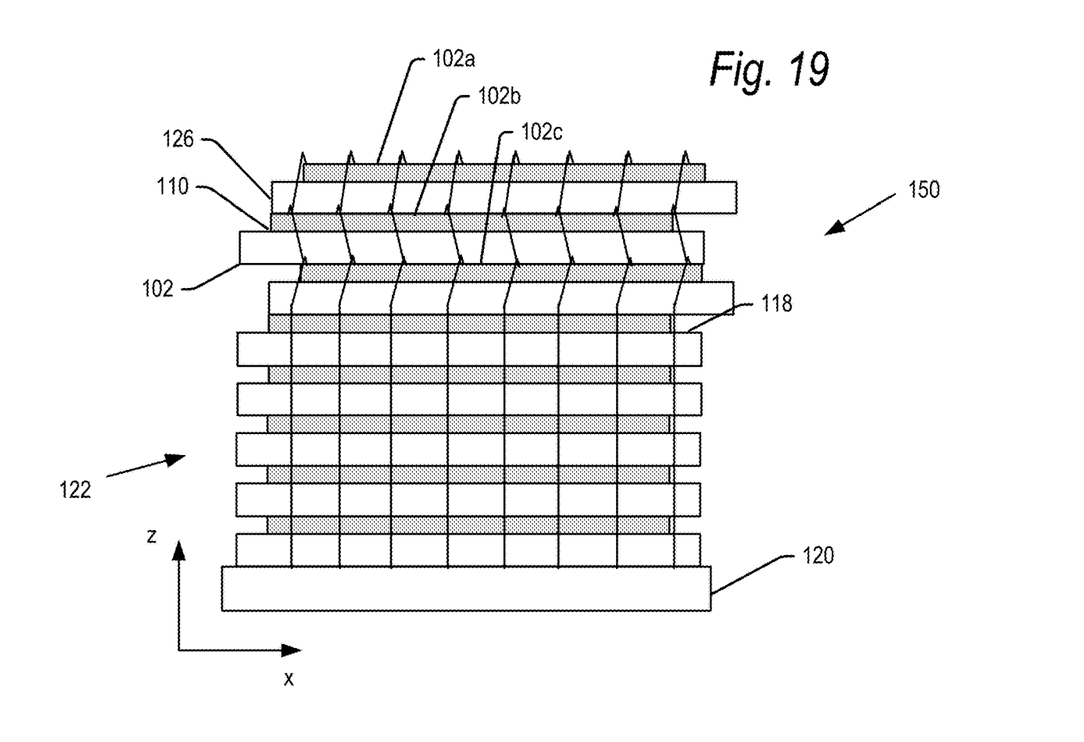
FIG. 19 is a front edge view of an alternative embodiment of the present technology.

In embodiments described above, the uppermost die 102a is strengthened against cracking by offsetting the die so that one edge is supported directly on the next lower die, and the opposite edge has a relatively large thickness where it overhangs the next lower die. It is understood that the dies other than just the uppermost die may be offset along the x-axis to add strength to those dies as well. FIG. 19 illustrates an example where the uppermost three dies, die 102a, 102b and 102c, are each offset from each other not only along the y-axis, but also along the x-axis in a manner described above with respect to die 102a. In the embodiment shown in FIG. 19, the dies 102a, 102b and 102c are offset in alternating directions along the x-axis. In further embodiments, the dies 102a, 102b and 102c may each be offset along the x-axis in the same direction. It is understood that the uppermost two dies or more than the uppermost three dies may be offset from each other along the x-axis in further embodiments.

In summary, an example of the present technology relates to a semiconductor device, comprising: a plurality of semiconductor dies, the plurality of semiconductor dies each comprising: an interior portion having a first thickness, and an exterior portion along first and second opposed edges having a second thickness less than the first thickness; wherein the plurality of semiconductor dies are stacked on top of each other in a stack such that a group of semiconductor dies at a bottom of the stack are aligned with each other with respect to a first axis, and at least an uppermost die is offset along the first axis with respect to the next lower die, the amount of the offset positioning the exterior portion of the uppermost die at the first edge over the interior portion of the next lower die.

In another example, the present technology relates to a semiconductor device, comprising: a plurality of n semiconductor dies, the plurality of semiconductor dies each comprising: an interior portion having a first thickness, and an exterior portion along first and second opposed edges having a second thickness less than the first thickness; wherein the plurality n of semiconductor dies are stacked on top of each other in a stack and configured to add strength and resistance to cracking of an uppermost semiconductor die by aligning a group of n−1 semiconductor dies at a bottom of the stack with each other with respect to a first axis, and offsetting the uppermost die along the first axis with respect to the next lower die, the amount of the offset positioning the exterior portion of the uppermost die at the first edge over the interior portion of the next lower die.

In a further example, the present technology relates to semiconductor device, comprising: a plurality of n semiconductor dies, the plurality of semiconductor dies each comprising: an interior portion having a first thickness, and an exterior portion along first and second opposed edges having a second thickness less than the first thickness; wherein the plurality n of semiconductor dies are stacked on top of each other; means for adding strength and resistance to cracking of an uppermost semiconductor die by aligning a group of n−1 semiconductor dies at a bottom of the stack with each other with respect to a first axis, and offsetting the uppermost die along the first axis with respect to the next lower die, the amount of the offset positioning the exterior portion of the uppermost die at the first edge over the interior portion of the next lower die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a plurality of semiconductor dies stacked on each other, the plurality of semiconductor dies each comprising:
   an interior portion having a first thickness, and
   an exterior portion along first and second opposed edges having a second thickness less than the first thickness;
   wherein the plurality of semiconductor dies comprise first and second semiconductor dies, the first semiconductor die stacked on top of the second semiconductor die, the first semiconductor die is offset along a first axis with respect to the second semiconductor die, the amount of the offset positioning the exterior portion of the first semiconductor die at the first edge over the thicker interior portion of the second semiconductor die.

2. The semiconductor device of claim 1, wherein the interior portion of the first semiconductor die at the second edge overhangs the exterior portion of the next lower die.

3. The semiconductor device of claim 1, wherein the difference in thicknesses between the interior portion and exterior portion is that the interior portion includes a polyimide/passivation layer extending above a surface of the exterior portion.

4. The semiconductor device of claim 3, wherein exterior portion is a portion of a dicing street where the plurality of semiconductor dies are diced from a wafer.

5. The semiconductor device of claim 1, wherein the plurality of semiconductor dies in the stack are offset from each other in a stepped configuration along a second axis orthogonal to the first axis.

6. The semiconductor device of claim 5, wherein the plurality of semiconductor dies in the stack are offset from each other in the same direction along the second axis in the stepped configuration.

7. The semiconductor device of claim 5, wherein some of the plurality of semiconductor dies in the stack are offset from each other in a first direction along the second axis in the stepped configuration, and wherein some of the plurality of semiconductor dies in the stack are offset from each other in a second direction, opposite the first direction, along the second axis in the stepped configuration.

8. The semiconductor device of claim 5, further comprising wire bonds extending along the second direction between corresponding die bond pads on the plurality of semiconductor dies in the stack.

9. The semiconductor device of claim 1, wherein the plurality of dies comprise a group of one or more dies in addition to the first and second semiconductor dies, the group of one or more dies being vertically aligned along the first axis with the second semiconductor die.

10. The semiconductor device of claim 9, wherein the first semiconductor die is the uppermost semiconductor die in the plurality of stacked semiconductor dies.

11. The semiconductor device of claim 1, wherein the plurality of semiconductor dies are one of 2D NAND flash memories or 3D Bit Cost Scaling flash memories.

12. A semiconductor device, comprising:
    a group of three or more semiconductor dies, the semiconductor dies in the group of semiconductor dies each comprising:
    an interior portion having a first thickness, and
    an exterior portion along first and second opposed edges having a second thickness less than the first thickness;
    wherein the group of semiconductor dies are stacked on top of each other in a stack and configured to add strength and resistance to cracking of an uppermost semiconductor die by vertically aligning a sub-group of the group of semiconductor dies below the uppermost semiconductor die with each other with respect to a first axis, and offsetting the uppermost die along the first axis with respect to the next lower die in the sub-group of semiconductor dies, the amount of the offset positioning the exterior portion of the uppermost die at the first edge over the interior portion of the next lower die.

13. The semiconductor device of claim 12, wherein the interior portion of the uppermost die at the second edge overhangs the exterior portion of the next lower die.

14. The semiconductor device of claim 12, wherein the difference in thicknesses between the interior portion and exterior portion is that the interior portion includes a polyimide/passivation layer extending above a surface of the exterior portion.

15. The semiconductor device of claim 12, wherein the first edge of the exterior portion of the uppermost semiconductor die is vertically aligned over an edge of the interior portion of the next lower die.

16. The semiconductor device of claim 12, wherein the group of semiconductor dies in the stack are offset from each other in a stepped configuration along a second axis orthogonal to the first axis.

17. The semiconductor device of claim 16, wherein the group of semiconductor dies in the stack are offset from each other in the same direction along the second axis in the stepped configuration.

18. The semiconductor device of claim 16, wherein some of the group of semiconductor dies in the stack are offset from each other in a first direction along the second axis in the stepped configuration, and wherein some of the group of semiconductor dies in the stack are offset from each other in a second direction, opposite the first direction, along the second axis in the stepped configuration.

19. The semiconductor device of claim 16, further comprising wire bonds extending along the second direction between corresponding die bond pads on the group of semiconductor dies in the stack.

20. A semiconductor device, comprising:
a group of three or more semiconductor dies, the plurality of semiconductor dies each comprising:
an interior portion having a first thickness, and
an exterior portion along first and second opposed edges having a second thickness less than the first thickness;
wherein the group of semiconductor dies are stacked on top of each other;
means for adding strength and resistance to cracking of an uppermost semiconductor die by vertically aligning a sub-group of semiconductor dies from the group of semiconductor dies below an uppermost semiconductor die each other with respect to a first axis, and offsetting the uppermost die along the first axis with respect to a next lower die in the sub-group, the amount of the offset positioning the exterior portion of the uppermost die at the first edge over the interior portion of the next lower die.

* * * * *